(12) United States Patent
Calisch et al.

(10) Patent No.: US 11,099,243 B2
(45) Date of Patent: Aug. 24, 2021

(54) DIFFERENTIAL MAGNETIC LOAD CELLS FOR COMPACT LOW-HYSTERESIS FORCE AND TORQUE MEASUREMENTS

(71) Applicant: Massachusetts Institute of Technology, Cambridge, MA (US)

(72) Inventors: Samuel E. Calisch, Canbridge, MA (US); Neil A. Gershenfeld, Cambridge, MA (US)

(*) Notice: Subject to any disclaimer, the term of this patent is extended or adjusted under 35 U.S.C. 154(b) by 217 days.

(21) Appl. No.: 16/178,643

(22) Filed: Nov. 2, 2018

(65) Prior Publication Data

US 2019/0146043 A1 May 16, 2019

Related U.S. Application Data

(60) Provisional application No. 62/584,302, filed on Nov. 10, 2017.

(51) Int. Cl.
*G01R 33/038* (2006.01)
*G05G 9/047* (2006.01)
*G01R 33/00* (2006.01)

(52) U.S. Cl.
CPC ..... *G01R 33/0385* (2013.01); *G01R 33/0094* (2013.01); *G05G 9/047* (2013.01); *G05G 2009/04755* (2013.01)

(58) Field of Classification Search
CPC .............. G01R 33/038; G01R 33/0385; G01R 33/072; G01R 33/0094; G05G 9/047; G05G 2009/04755; G05G 2009/04762; G01L 1/12; G01L 1/122; G01L 1/125; G01L 3/104; G01L 3/102; B62D 6/10
See application file for complete search history.

(56) References Cited

U.S. PATENT DOCUMENTS

| 5,831,596 | A | 11/1998 | Marshall et al. |
| 7,114,398 | B2 * | 10/2006 | Haines ............. A63B 24/00 |
| 10,582,023 | B2 | 3/2020 | Kwon et al. |
| 2016/0216168 | A1 * | 7/2016 | Itomi ............ B62D 15/0215 |

* cited by examiner

*Primary Examiner* — Son T Le
*Assistant Examiner* — Dustin R Dickinson
(74) *Attorney, Agent, or Firm* — Robert Greenspoon; Flachsbart & Greenspoon, LLC

(57) ABSTRACT

Magnetic load cells that measure force and/or torque are constructed from magnets and one or more arrays of magnetic field sensors. The magnetic field sensors are structured in a tight array where the array is attached to a first portion of a frame. The magnets are operated in pairs polarized in opposition to one-another. In particular, pairs of concentric magnets create sharp field boundaries. The magnets are attached to a second portion of the frame with the magnets separated from the array of field sensors by a small gap. The second portion of the frame is free to displace or rotate in relation to the first portion of the frame when a force or torque is applied to it. The displacement results in a measurable differential change in magnetic field reported by the array that can be sampled and processed to relate to the applied force or torque.

20 Claims, 15 Drawing Sheets

DIFFERENTIAL MAGNETIC LOAD CELLS FOR COMPACT LOW-HYSTERESIS FORCE AND TORQUE MEASUREMENTS

This application is related to, and claims priority from, U.S. Provisional patent application No. 62/584,302 filed Nov. 10, 2017. Application 62/584,302 is hereby incorporated by reference in its entirety.

BACKGROUND

Field of the Invention

The present invention relates generally to the field of force and torque measurement and more particularly to differential magnetic load cells that are compact and have low hysteresis for such measurements.

Description of the Problem Solved

Force measurement is an essential technology across a range of disciplines, including robotics, medicine, materials, manufacturing, metrology, and many others. Many applications require a transducer with very high stiffness, so that the displacements induced by the measured forces are very small. These measurements are commonly performed by measuring the strain of a structure. Typically, this is done using a strain gauge which is bonded to a surface of a structural member. When the structure experiences strain, the strain gauge changes resistance or some other physical parameter very slightly. This signal can be detected with a sensitive input circuit and sent in amplified form to a processor. It can then be isolated and possibly filtered using signal processing techniques. With good bonds, the true strain seen by the member being measured is also seen by the strain gauge. This approach has long been favored, and is well-known in the art, because it produces repeatable measurable results while allowing the strained member to remain as stiff as possible (and hence, not interfere with the operation of the measured device).

The strain of a particular member may also be determined by measuring the displacement of a point or surface rather than measuring the material strain directly (as with the strain gauge). This can be done without any direct contact with the member under strain, and can be advantageous, because it eliminates the uncertainty generated by the bond between the member and a strain gauge. It is a well-known problem that strain gauge bonds can exhibit hysteresis, be temperature dependent, and can, in general, be a point of failure of the device. Measuring the displacement of a point or surface using a non-contact method, on the other hand, can circumvent many of these disadvantages. Further, devices that perform this type of non-contact measurement can be made so that all of the electrically connected parts of the device are on one side of a flexure, and no cables, slip rings or the like are required to bridge a spatially varying gap.

Prior art non-contact position measurements have historically not had high enough resolution for load cell applications, but have been used commonly for applications that can tolerate larger displacements. For instance, joystick inputs for machines are often sensed using a non-contact magnetic field measurement (for example see U.S. Pat. No. 5,831,596). Similarly, many automotive applications such as gas pedal displacement, shifter positions and the like that sense large displacements are turning to non-contact measurement technology for the robustness it offers.

Advances in high sensitivity, non-contact measurement has made it possible to use this technology for the small displacements required by force sensing applications. For instance, capacitive (electric field) sensing is used in high resolution digital calipers and has found use in load cells. An important disadvantage to these prior art techniques is that relatively large overlapping areas are required for a low noise measurement. In many compact load cell applications (particularly for measuring many degrees of freedom), realizing these geometries can be challenging.

It would be extremely advantageous to have compact, low-hysteresis force and torque measuring devices that use a magnetic field for non-contact, very small displacement, measurements that do not require any large overlapping areas.

SUMMARY OF THE INVENTION

The present invention uses the magnetic field instead of the electric field for non-contact displacement measurement. This results in families of differential magnetic load cells for force and/or torque measurement that include one or more magnetic field generating devices and one or more magnetic field sensing devices. These devices are usually arranged in pairs on opposite sides of a flexure. The magnetic field generating devices are arrangements of permanent magnets or electrically driven coils. The magnetic field sensing devices can be one of a number of room-temperature magnetic field sensing technologies, including Hall-effect sensors, magnetoresistive sensors, fluxgate sensors, magneto-inductive sensors, or magneto-electric sensors.

Typically, the magnetic field sensors are structured in a tight array where the array is attached to a first portion of a frame. The magnets are typically operated in pairs polarized in opposition to one-another to create a sharp field boundary between the fields of the two magnets. The magnets are attached to a second portion of the frame with the magnets separated from the array of field sensors by a small gap so that the field boundary is sensed by the array. The second portion of the frame is free to displace or rotate in relation to the first portion of the frame when a force or torque is applied to it. The displacement of the second portion of the frame in relation to the first portion of the frame results in a measurable differential change in magnetic field reported by the array that can be sampled and processed to relate to the applied force or torque.

DESCRIPTION OF THE FIGURES

Attention is now directed to several figures that illustrate features of the present invention.

Figure 1:
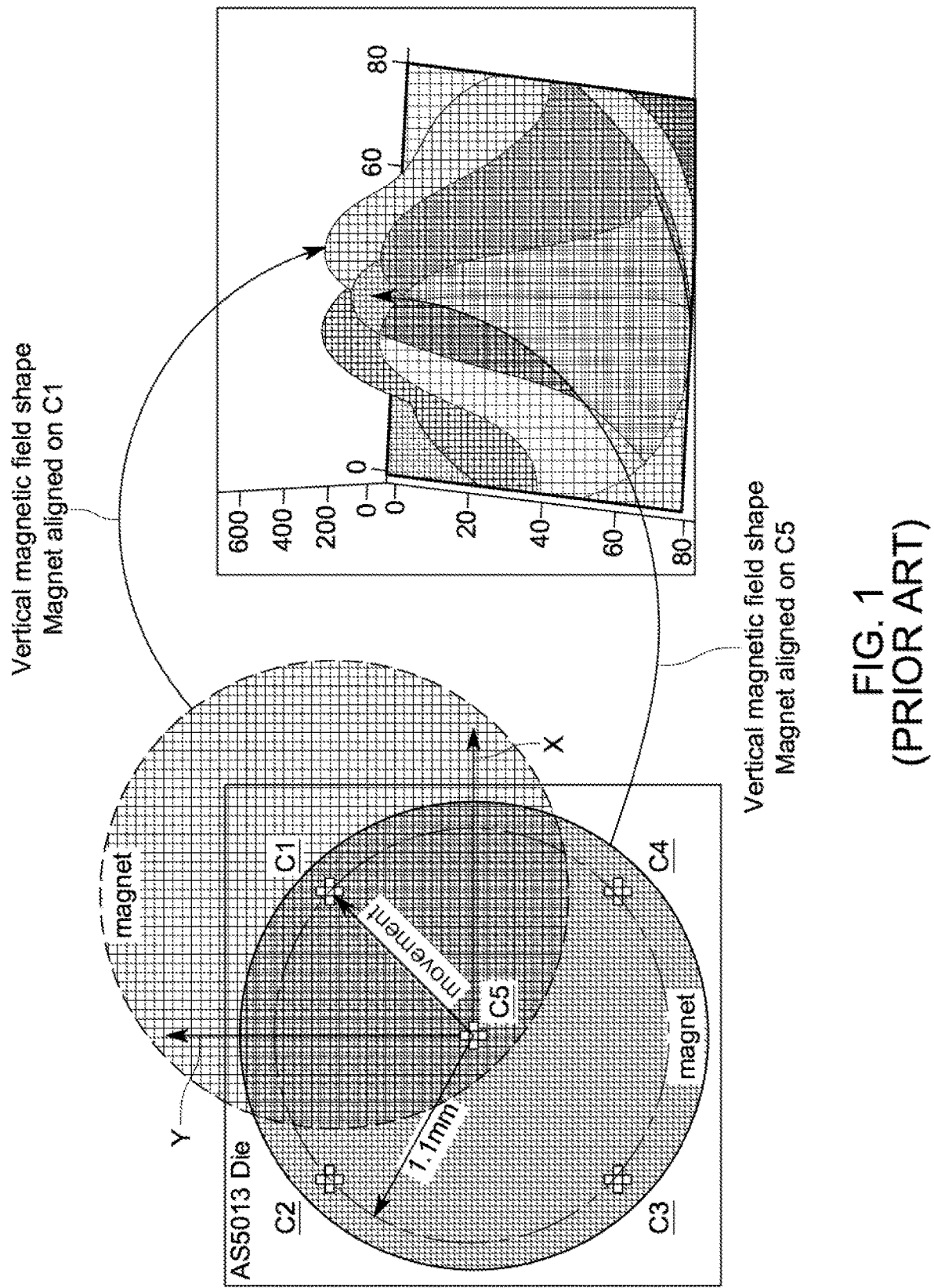
FIG. 1 shows an arrangement of Hall sensors in a prior art AS5013 chip.

Several drawings and illustrations have been presented to aid in understanding the present invention. The scope of the present invention is not limited to what is shown in the figures.

DESCRIPTION OF THE PREFERRED EMBODIMENTS

The present invention relates to load cell sensors that measure force and/or torque by using a magnetic field for non-contact displacement measurement. This results in families of differential magnetic load cells for force and/or torque measurement that include one or more magnetic field generating devices and one or more magnetic field sensing devices. These devices are usually arranged in pairs on opposite sides of a flexure.

The magnetic field generating devices are arrangements of permanent magnets or electrically driven coils, while the magnetic field sensing devices can be one of a number of room-temperature magnetic field sensing technologies, including Hall effect sensors, magnetoresistive sensors, fluxgate sensors, magneto-inductive sensors, or magneto-electric.

Among these, Hall effect sensors are most ubiquitous, and are available at extremely low cost in dense packaging. Magnetoresistive and fluxgate devices have lower noise than Hall effect sensors, but are more expensive and less dense. Magneto-inductance and magneto-electric sensors may offer desirable alternatives, but both are in early stages of development, and not yet widely available. Hall effect sensors are sensitive to the component of magnetic field through their thickness, which for most chip fabrication processes, means that they are only sensitive to the Z component of the field relative to the chip package. There are some counterexamples, where "3D Hall elements" are produced by building three individual elements oriented normal to the three coordinate directions, but these ICs are less dense and more expensive than those with planar Hall elements. Fluxgate sensors, by comparison, are sensitive in the plane of fabrication, and other technologies are sensitive to total magnetic field strength instead of the component along a single axis.

All of these families of sensors can be used to advantage in various embodiments of the present invention. For example, if mass production, dense packaging and low price are desired, Hall effect sensors can be used to advantage providing that a single magnetic field component is sufficient for the measurement. When low noise is important, magnetoresistive or fluxgate sensors can be used.

As has been previously stated, non-contact magnetic sensing in itself is well-known in the art (e.g., magnetic sensing has been used in joysticks and other input devices), but several techniques of the present invention allow much greater measurement sensitivity. This, in turn, permits the use of this technology in very stiff force sensors.

Embodiments of the present invention use magnetic field sensing devices that are composed of spatial arrays of sensor elements. Hall element sensors, in particular, are available in very precise arrays of sensors on a single silicon die. The measurements from elements in the array can be differentially combined to nullify external fields or displacements in directions that are not being measured. This means the devices can use very large gain values, creating very sensitive devices. Because the entire system is embedded on a single IC, the gain values are commonly adjustable on-the-fly, which broadens the working dynamic range of the sensor.

Embodiments of the present invention also use arrangements of multiple magnets that dramatically increases sensitivity. The sensing devices are usually positioned at the region of greatest rate of change of magnetic field strength with respect to the degrees of freedom of the flexure. This means that a given force produces the greatest change in the sensor output. For example, FIG. 1 shows the arrangement of 5 Hall effect sensors in the prior art AS5013 chip. This chip is designed to use a 2 mm diameter because the sensors are positioned in region of greatest rate of change of the Z component of field, around 1.1 mm radius from the magnet axis. It boasts two axis operation with a sensitivity of 10 microns.

Figure 2A:
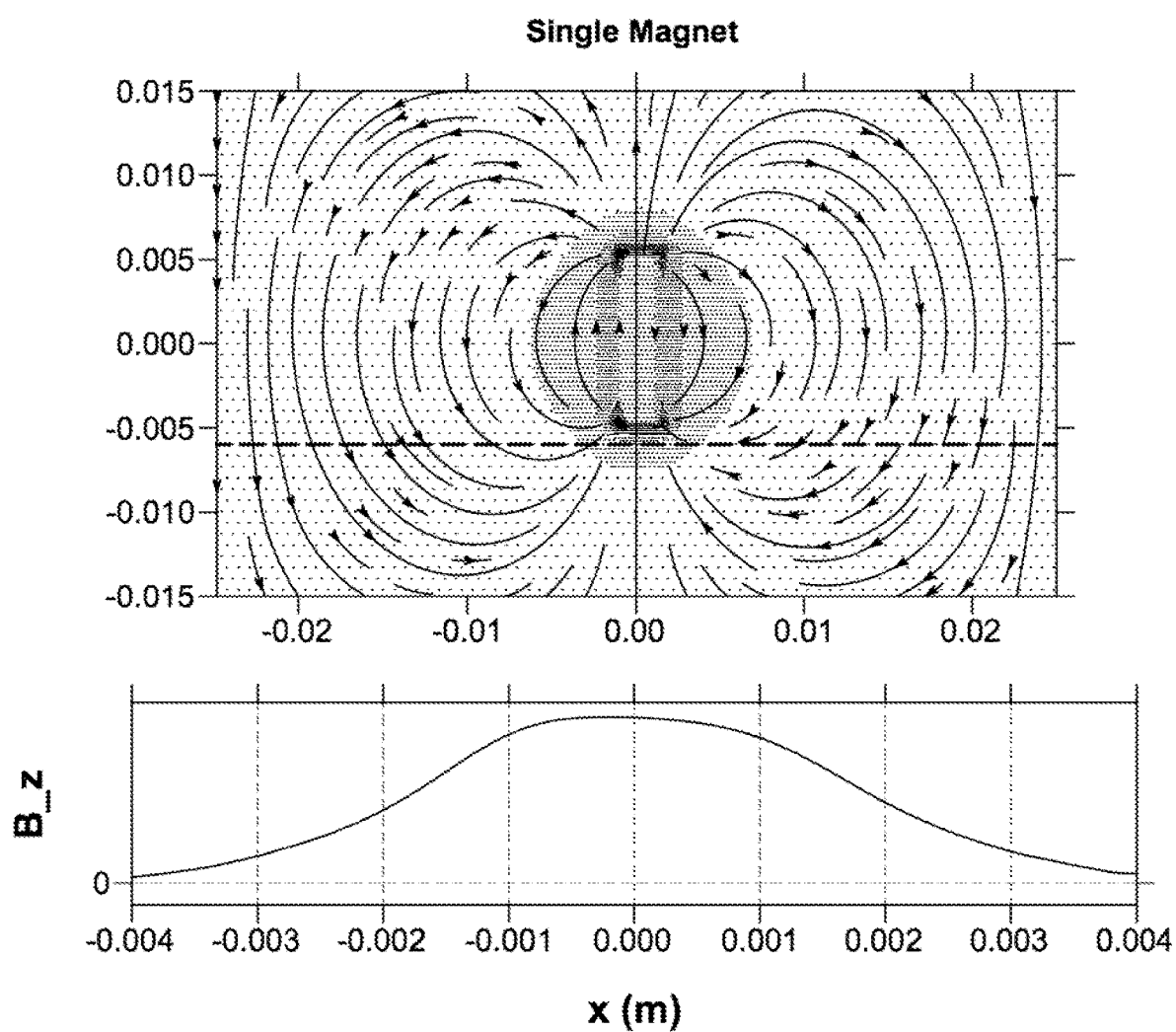
FIG. 2A shows a simulation of the field of a single permanent magnet.
Figure 2B:
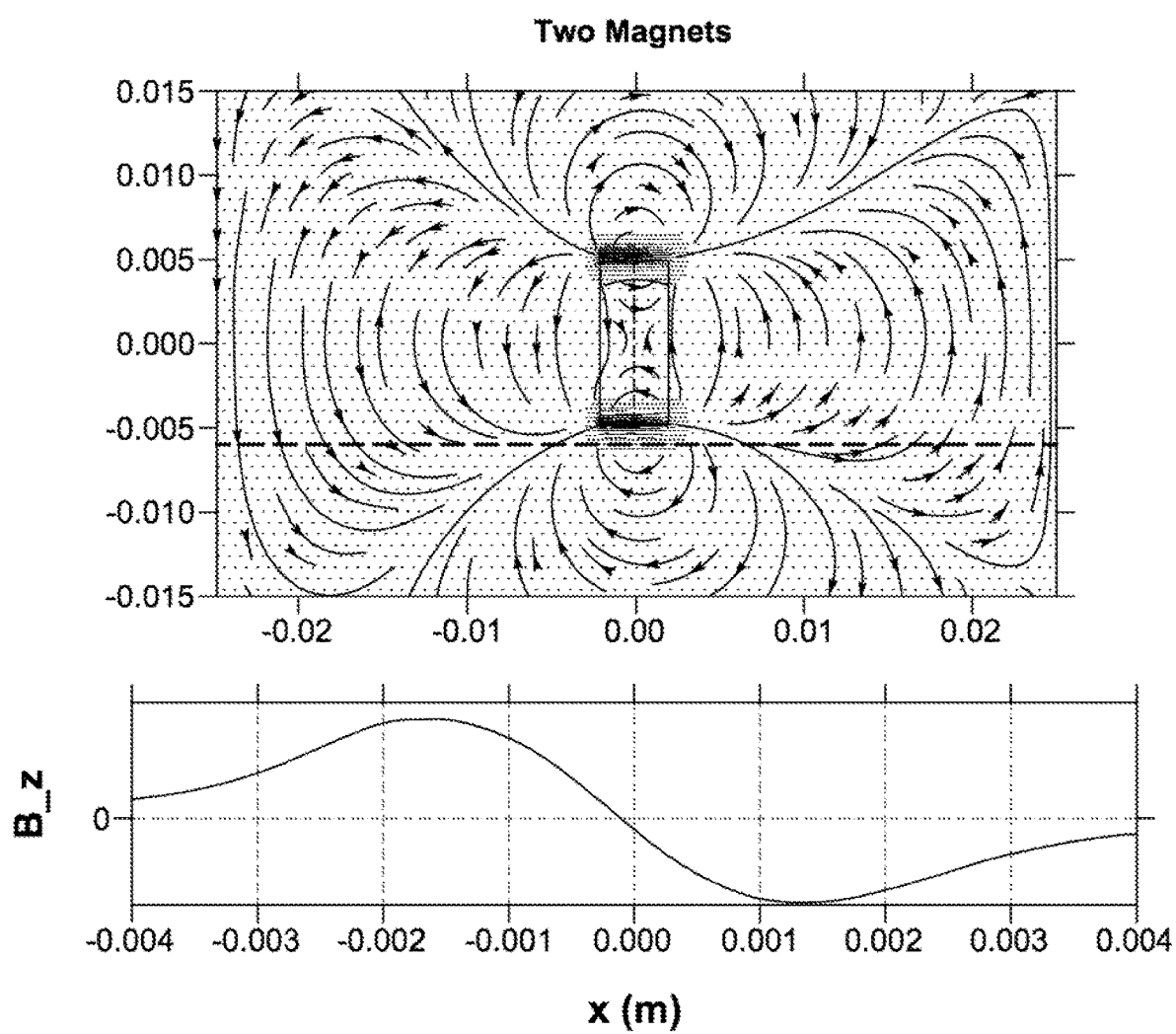
FIG. 2B is a similar simulation of the field of two permanent magnets arranged in opposition.

Using more than one magnet to generate field, however, allows the creation of much higher rates of change of the measured field component. FIG. 2A shows a simulation of the magnetic field around a single permanent magnet, while FIG. 2B show the field around a pair of opposing permanent magnets. In the latter case, the rate of change is very high at the interface between the two magnets. The coordinates in FIGS. 2A-2B are meters. In each figure, the top graph is a field chart, and the bottom graph shows the magnitude of the Z-component of the field. FIG. 2B shows sensitivity of approximately 200 nanometers (roughly 50 times more sensitive than with a single magnet).

Figure 3:
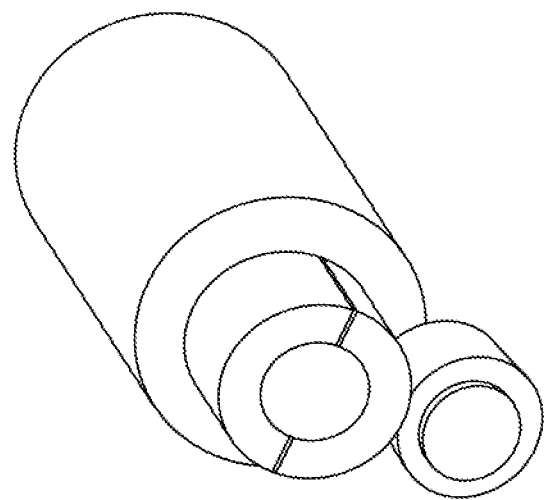
FIG. 3 depicts two concentric magnetic pairs (one fabricated by EDM machining, the other a prior art magnet sourced directly).

Using this technique, it is possible to construct a concentric magnet pair which has a boundary precisely where the sensors are positioned in the sensor chip (the AS5013 chip in particular embodiments). Two examples of such a pair are shown in FIG. 3. The concentric magnet on the left was constructed using EDM machining, while the magnet on the right was sourced directly. Field maps show that using a concentric pair of opposing magnets creates a much sharper boundary between the z-component fields of the two magnets than using a single magnet as was the case with non-concentric magnets previously discussed.

Thus, using one or more pairs of concentric opposing magnets and Hall effect or other magnetic sensor arrays can lead to the creation of load cells that can very accurately measure small applied forces, torques or both. What is required is that one or more sensor arrays be mounted adjacent to one or more concentric magnets (with typically a small air gap). The air gap need not be extremely small. This is an advantage because the air gap can change dimension subject to external forces without collision. Typical air gap values are approximately 0.5 mm. A frame with flexures can be created to hold the magnets and sensors in such a way that the applied force or torque causes the magnets to move slightly in relation to the sensors. Optionally, pairs of sensor arrays/magnets can be operated differentially to cancel unwanted noise.

Digital interfaces to these sensors can be efficiently bussed because the measurement time (100-1000 microseconds, typically) is much longer than the transmission time (10 microseconds, typically). For this reason, the devices can also be linked wirelessly, since 2.4 GHz packet radios are capable of round-trip packet times of less than 100 microseconds. In this way, many sensors can be used on the same bus with little timing overhead. Having more sensors gives greater ability to image the magnetic field, for instance by using a Taylor expansion of the field and fitting the localized measurements to the first and higher order derivatives. This gives a greater signal-to-noise ratio and an increased ability to discern individual components of force. Further, temperature sensor chips can be included on these busses offering fine-grained temperature compensation. It is well-known that thermal drift is a source of error in these types of measurements, so sophisticated temperature measurement significantly increases the accuracy of the readings.

EXAMPLES OF PARTICULAR EMBODIMENTS

Single Axis Device

Figure 4A:
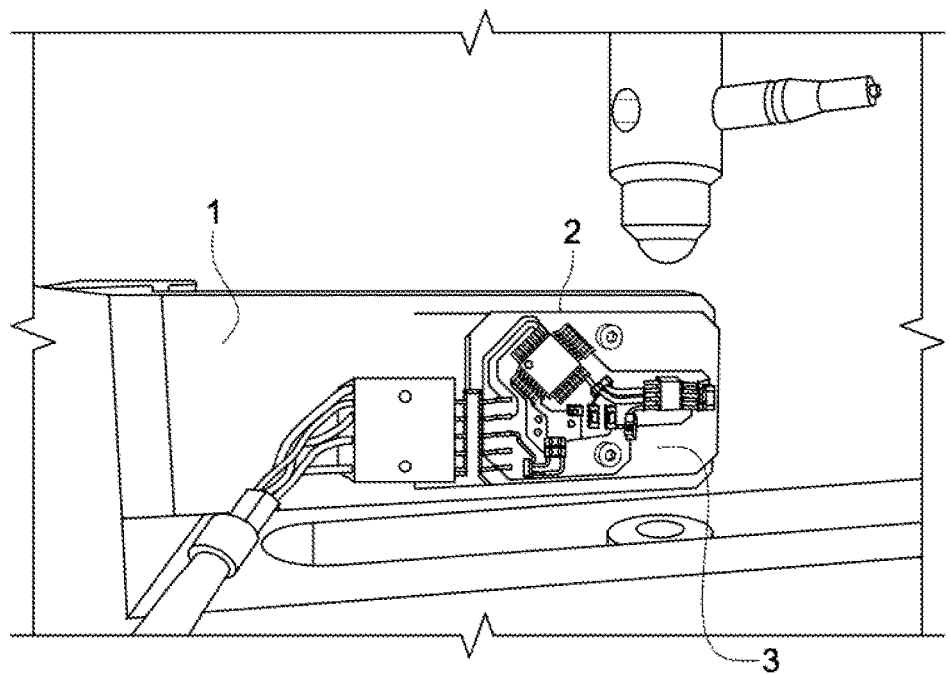
FIG. 4A shows a single axis differential magnetic load cell prototype.
Figure 4B:
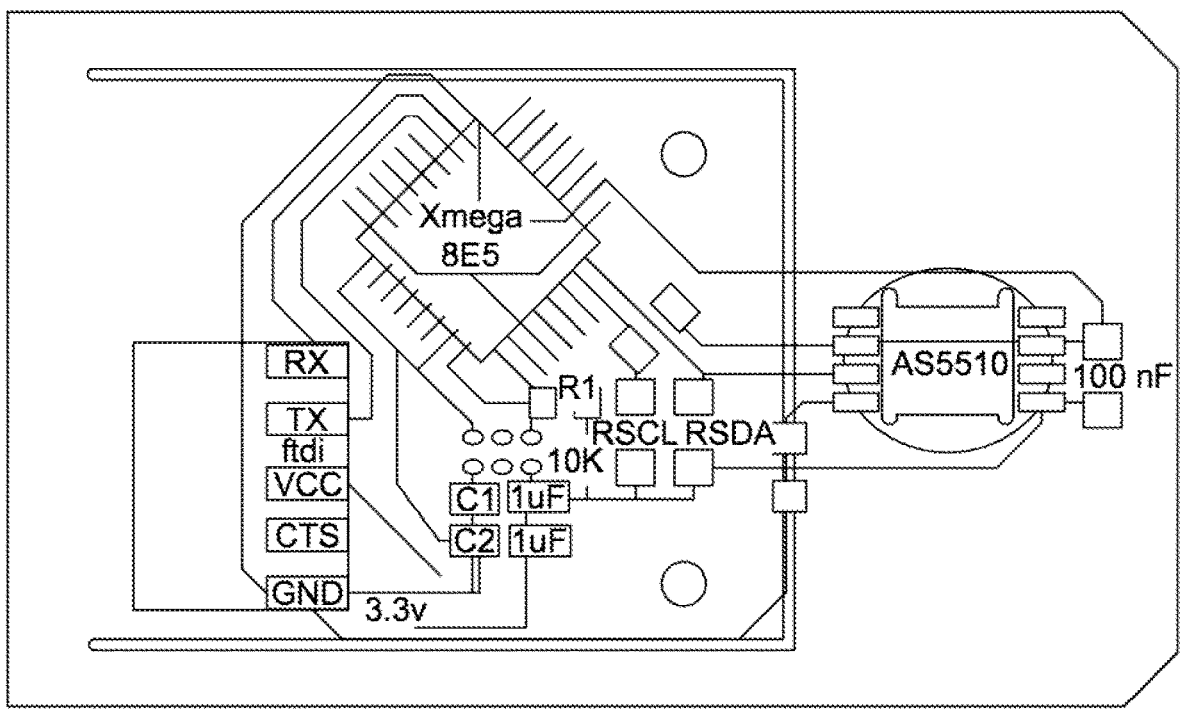
FIG. 4B shows a circuit board layout for the load cell of FIG. 4A

The first example of a differential magnetic load cell is a single axis measurement device based on the Austrian Microsystems AS5510 10 bit linear encoder IC, which boasts 500 nm resolution. This prototype is shown in FIG. 4A with its circuit board layout shown in FIG. 4B. The circuit board (3) is mounted to a piece of waterjet aluminum (1) with a flexure (2) cut into it. A magnet rests in a hole on the moving part of the flexure. The flexure is designed to have a stiffness of approximately 5 um/Newton. The encoder needs an air gap of less than 1 mm, so the board is milled away inside the SOIC-8 footprint where the AS5510 chip is mounted and the part is flipped over to bring it closer to the magnet underneath. The device uses an 8 mm circular diametrically magnetized magnet. The chip can be operated at its highest sensitivity (+−12.5 mT full scale) and in slow mode (12.5 KHz as opposed to 50 KHz, but with 0.5 mT peak-to-peak noise as opposed to 0.8 mT).

Figure 4C:
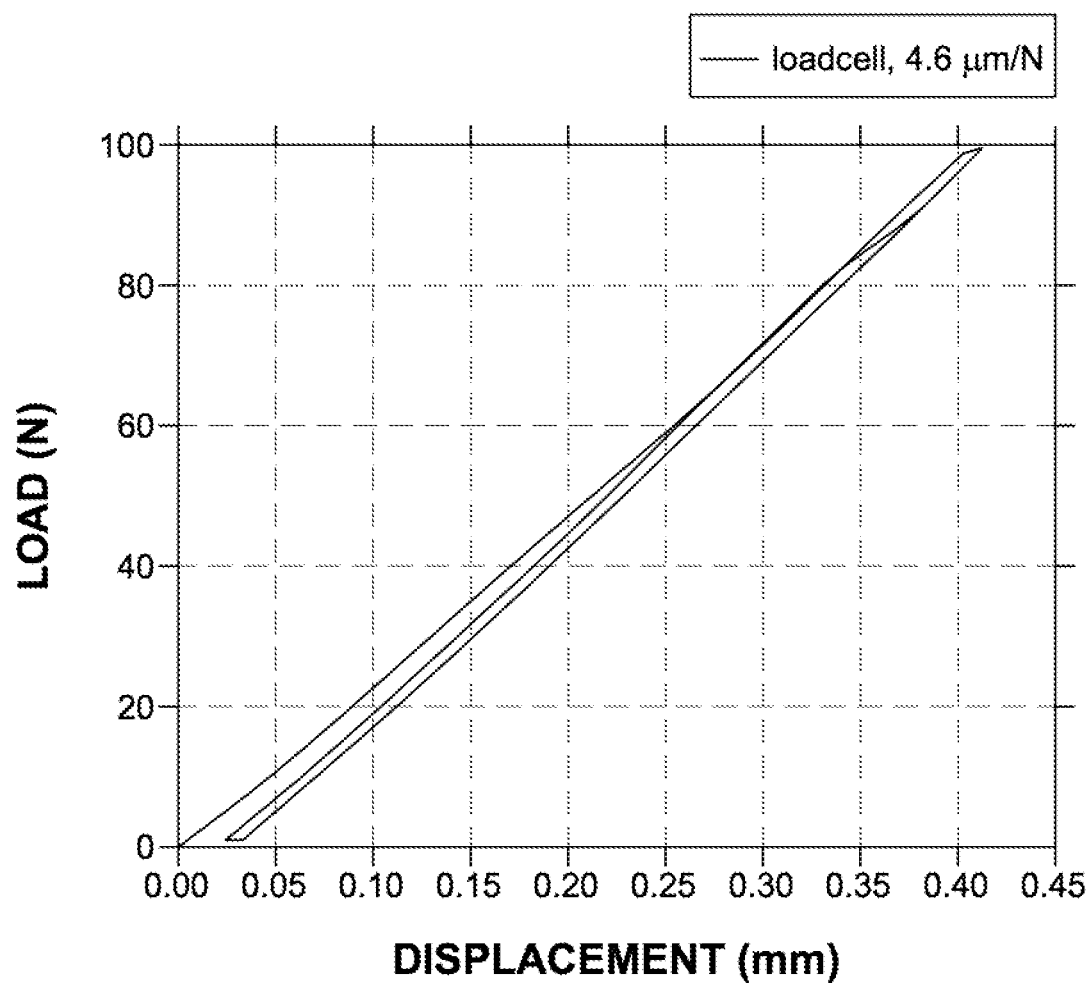
FIG. 4C is a load-displacement graph.
Figure 4D:
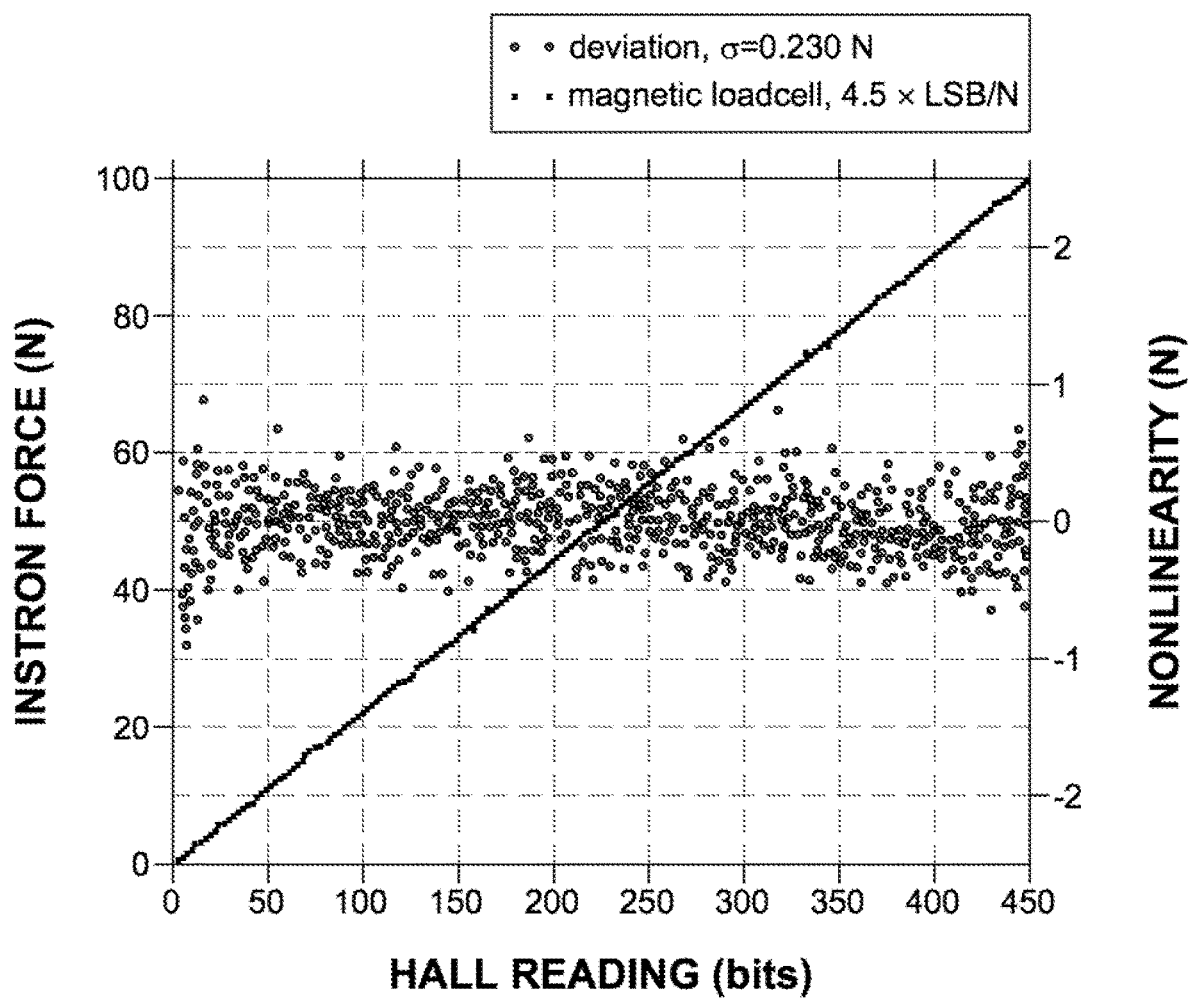
FIG. 4D is a graph of Hall reading vs. force with non-linearity superimposed.

The graphs in FIGS. 4C-4D show characterization of the prototype. It can be seen from the displacement/load graph of FIG. 4C that the flexure had a measured stiffness of 4.6 um/N, close to the designed 5 um/N. A displacement of 400 um (corresponding to around 100N) takes the encoder nearly over its full range (512 is the full range, as it measures positive and negative displacement to 10 bits (1024)). The graph in FIG. 4D is a plot of the relation between the two variables (force and Hall reading). Running at the full 12.5 kHz (i.e., without any summing of samples), the result is about 5×LSB per Newton. Further, the resolution can be increased by averaging samples depending on the bandwidth requirements of the application. Nonlinearity is also superimposed on this graph (dots).

6 Degree of Freedom Load Cell

Figure 5A:
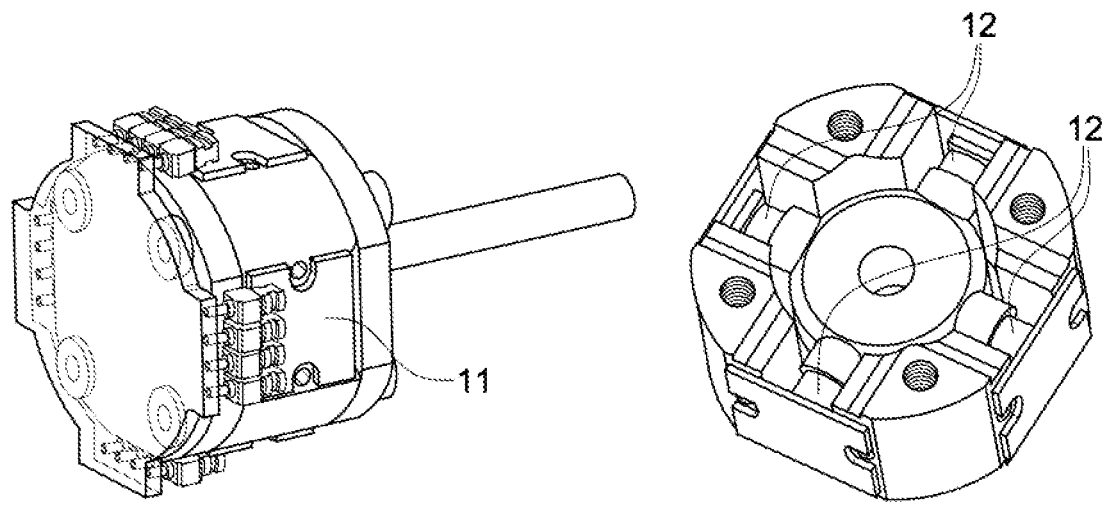
FIG. 5A shows a 6-axis magnetic load cell design.
Figure 5B:
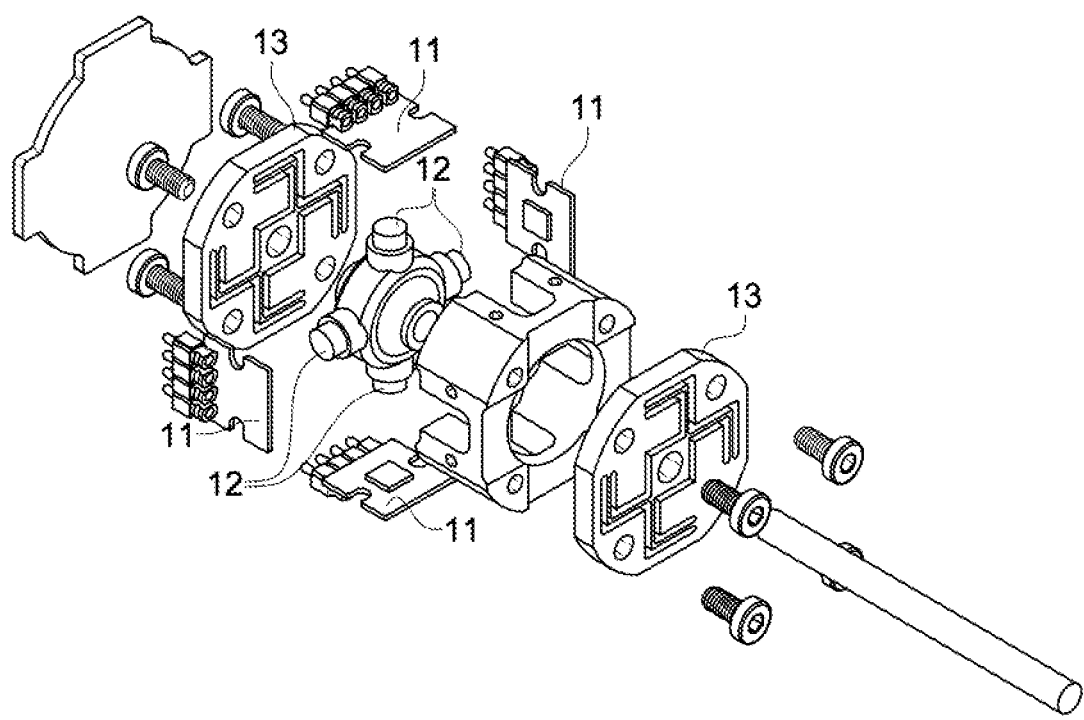
FIG. 5B is an exploded view of the load cell design of FIG. 5A.

A design for a six degree of freedom magnetic load cell is shown in FIG. 5A. The design uses a pair of plates with flexures (13) to set relative stiffnesses of displacements and rotations relative to the three coordinate axes. The flexures are designed to make it easy to tune relative stiffnesses, to have minimal cross-talk between axes, and to fit in the smallest bounding volume possible. Four concentric pairs of magnets (12) ride on a carrier supported by the flexures. When a force or torque is applied, the magnets experience a small displacement. An AS5013 Hall array chip (11) previously described is positioned a small distance (gap) away from each magnet (12). Two communication busses link the Hall arrays to a central circuit board where their readings are combined into estimates of force and/or torque applied to the device. It is also optionally possible to communicate the array signals wirelessly to a remote processor rather than use busses. The differential nature of the measurement (e.g., complimentary reading from opposing sides of the carrier) allows nullification of the change in readings caused by slight changes in air gap between the magnets and sensors. FIG. 5B shows an exploded view of this design. Again, the Hall sensors (11), the flexure plates (13), and the concentric magnets (12) can be seen.

Figure 6:
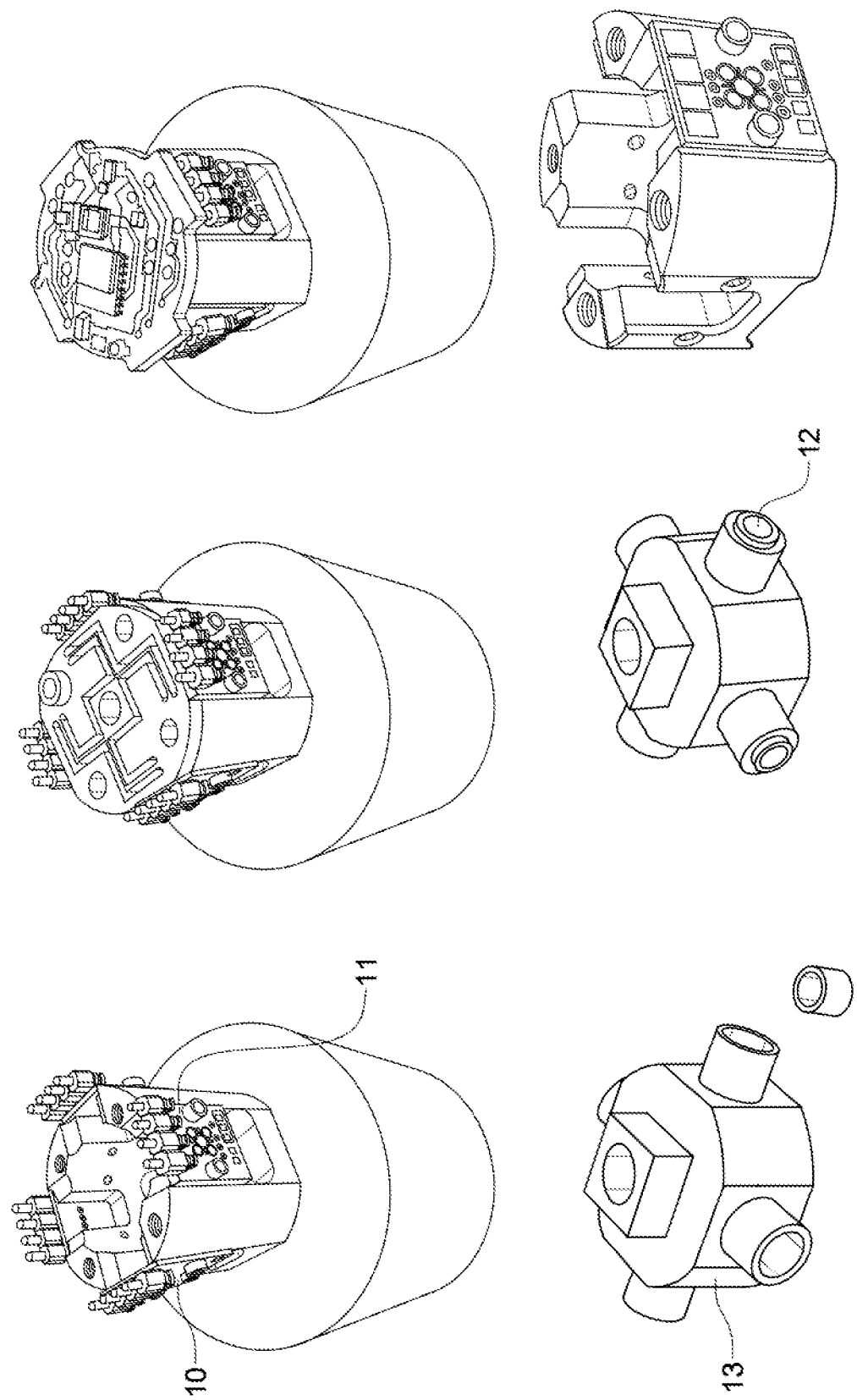
FIG. 6 shows a 6-axis load cell prototype.
Figure 7A:
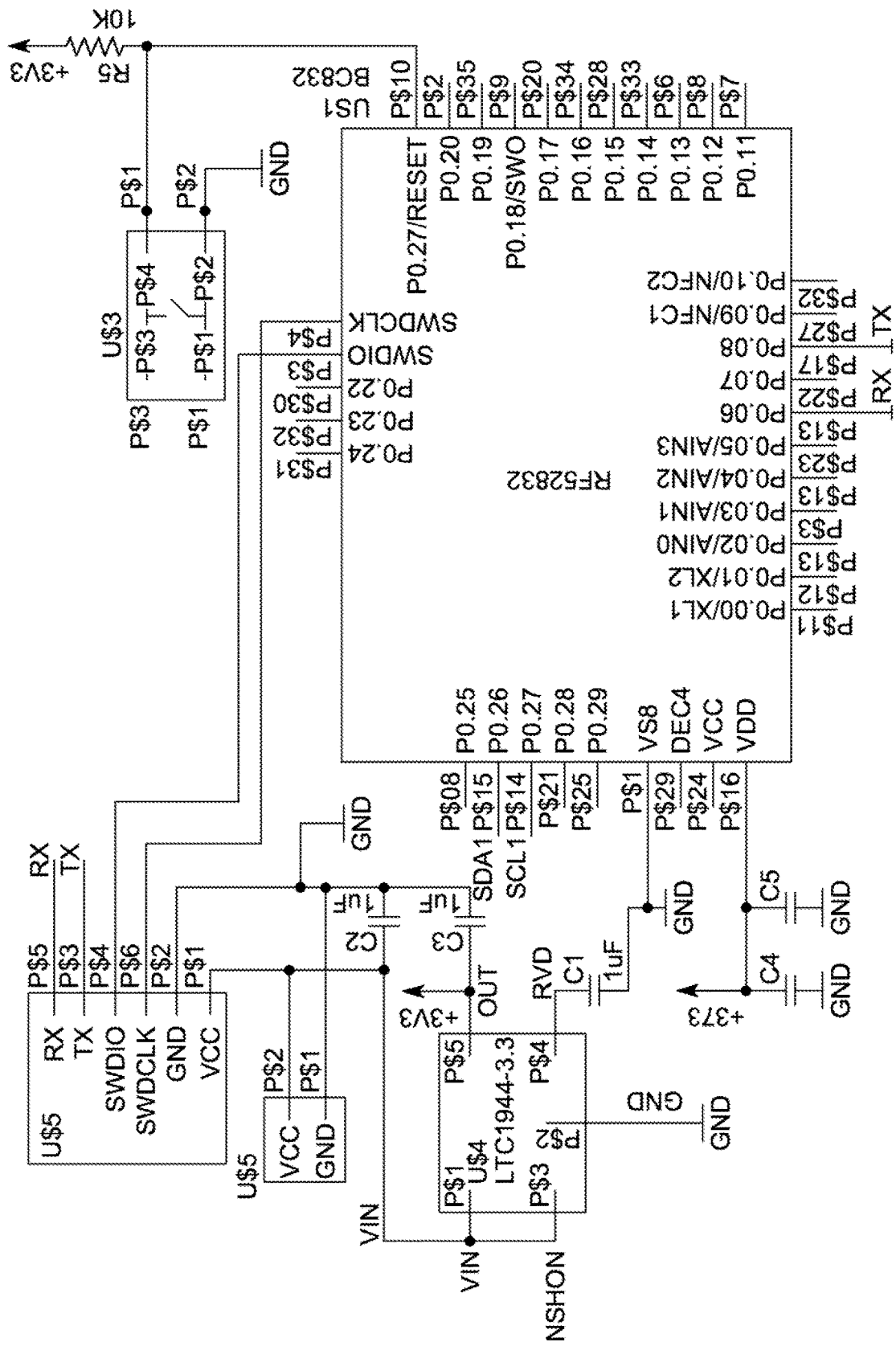
FIG. 7 is a block diagram the main circuit board and daughter circuit board of the 6-axis load cell prototype along with board layouts for the two circuit boards.
Figure 7B:
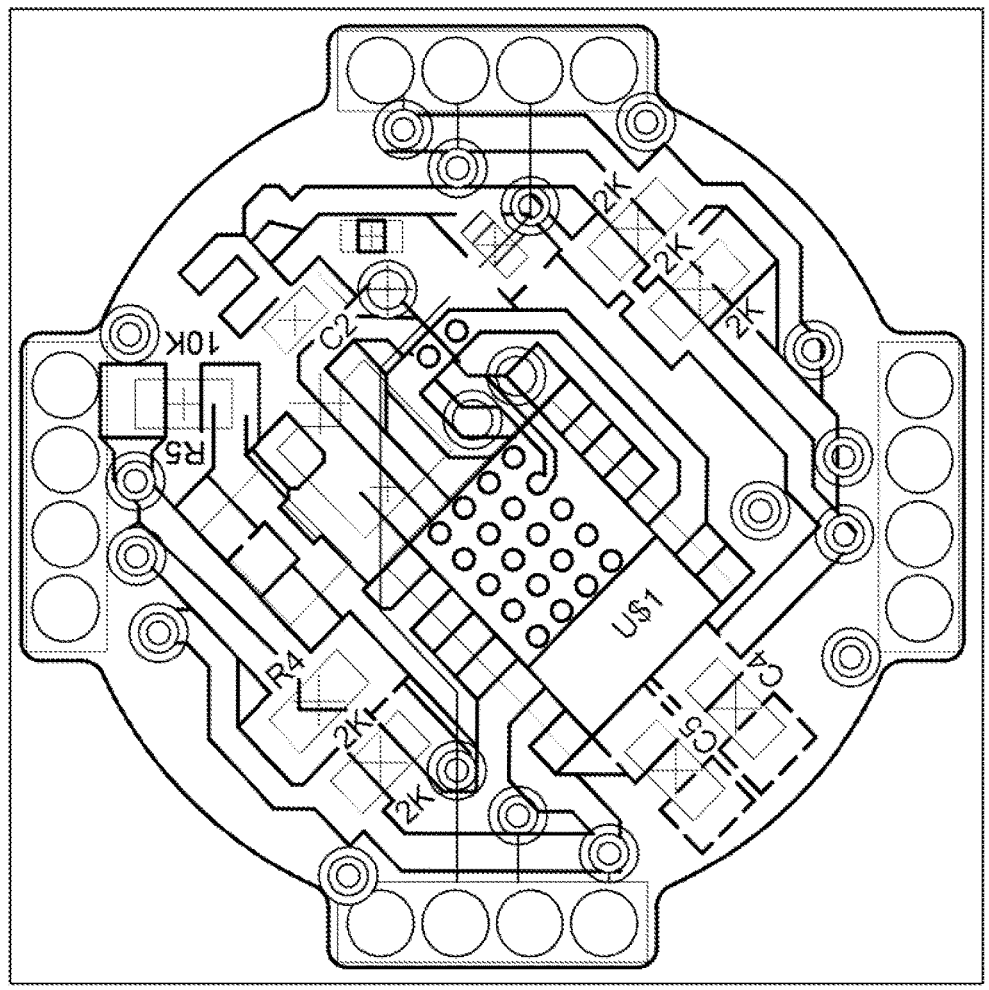
Figure 7B:
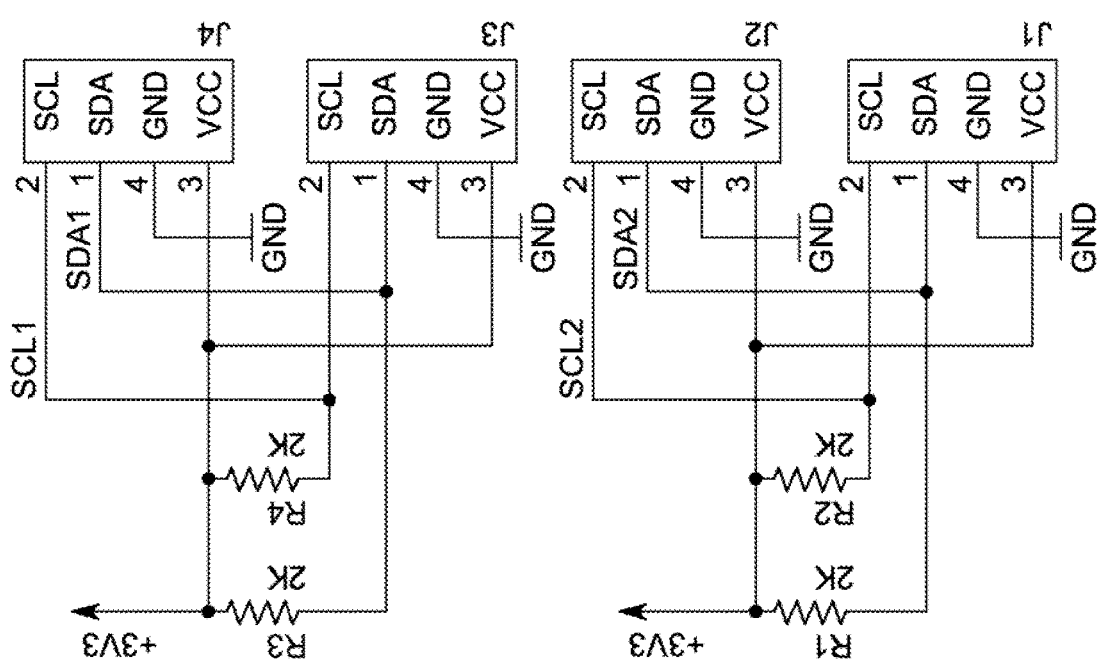
Figure 7C:
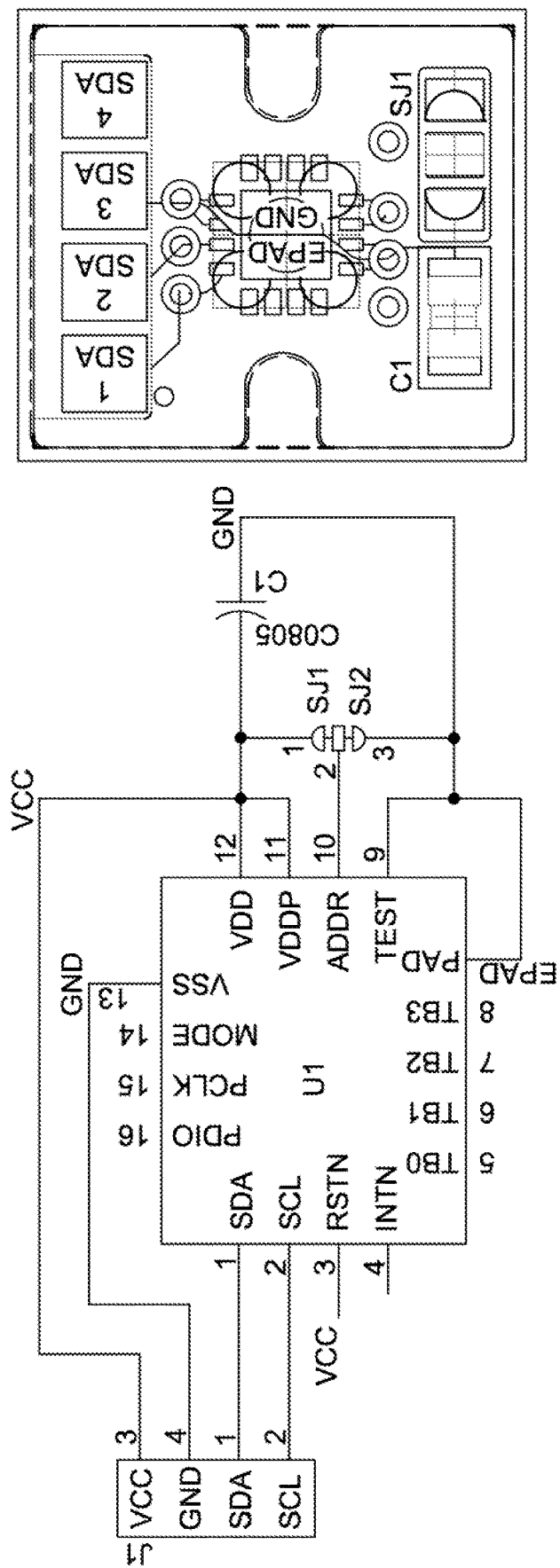

FIG. 6 shows views of a prototype of this design. Spring pin connectors (10) allow for independent positioning of each Hall array chip (11) to precisely calibrate the rest position of the device. The magnets (12) ride on the carrier (13).

FIG. 7 shows a block diagram the main circuit board of the 6-axis load cell and its daughter board. FIG. 7 also includes a layout of the main circuit board the daughter board. In the top schematic-board pair in FIG. 7, a microcontroller is shown (in this case an nRF52 ARM M4 with 2.4 GHz wireless) with the necessary auxiliary components for power and programming. This microcontroller in this embodiment is the master of two I2C busses, each with two headers for slave devices.

The lower schematic-board pair shows one of the slave devices. This board has the hall effect sensor array board that communicates from I2C back to the main microcontroller. There is a solder jumper to configure the I2C address. An alternate embodiment includes an I2C temperature sensor in order to compensate the hall sensor (which can drift with temperature).

Running two I2C busses allows more simultaneous communication to occur (the nRF52 has hardware resources for managing the busses simultaneously), compared to one bus for four slaves. This keeps the data rate high, especially as a temperature sensors is added. The connector used between the slaves and the main board uses spring-loaded "pogo" pins. This allows each of the slave boards to be "zeroed" over their respective magnets without affecting the others. A rigid connector does not allow this.

Single Axis Torque Cell

Figure 8A:
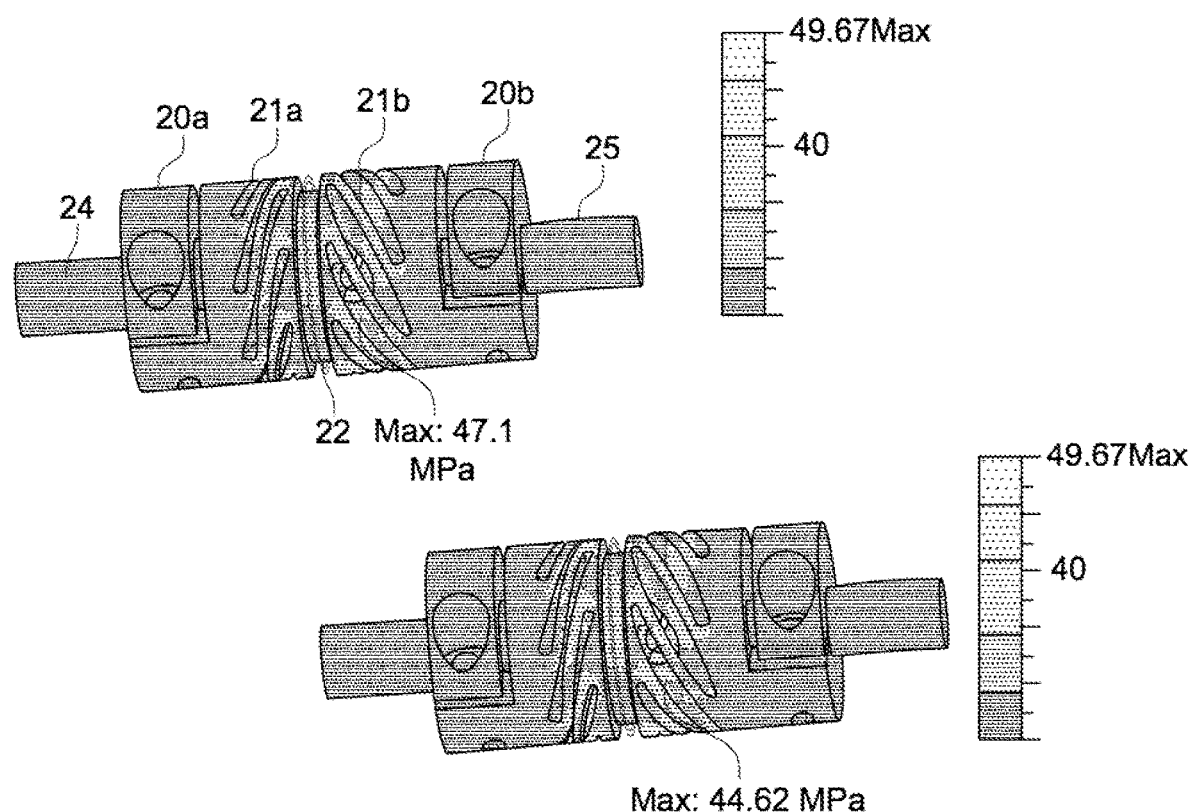
FIG. 8A shows a single axis torque cell design.

FIG. 8A shows a single axis torque cell design. This mechanism represents a non-contact torque cell. Most prior art torque measurement devices have a rotating part and a non-rotating frame. This requires the use a slip ring or radio telemetry to transmit the measured values from the rotating part to a non-rotating frame. The embodiment shown in FIG. 8A does not require this type of communication. Depending on requirements, the stiffness and range can be dialed up and down. An axially magnetized ring magnet, or for more sensitivity, an opposing pair of ring magnets are mounted on the flexure.

The device includes three rigid parts (20a), (20b) and (22), joined by two flexural parts (21a) and (21b). The two outside rigid parts (20a, 20b) are clamped to input (24) and output (25) shafts respectively. When a torque is applied between the input and output shafts, the central rigid part (22) is translated by the flexural parts. A clockwise torque causes a translation of the central part (22) in one direction, while a counterclockwise torque causes a translation in the opposite direction. This embodiment is designed so that the total torsional stiffness of the device (between input and output shafts) remains quite high.

The axial displacement is measured using a pair of differential Hall elements in the stationary frame (20a, 20b and 22) that sense movement of the axially polarized ring magnet. The differential pair allows the subtracting out of small deviations in the gap between the magnet and sensor.

The sampling times can also be synchronized with shaft rotation to avoid any misalignment of the ring magnet and rotation axes.

Figure 8B:
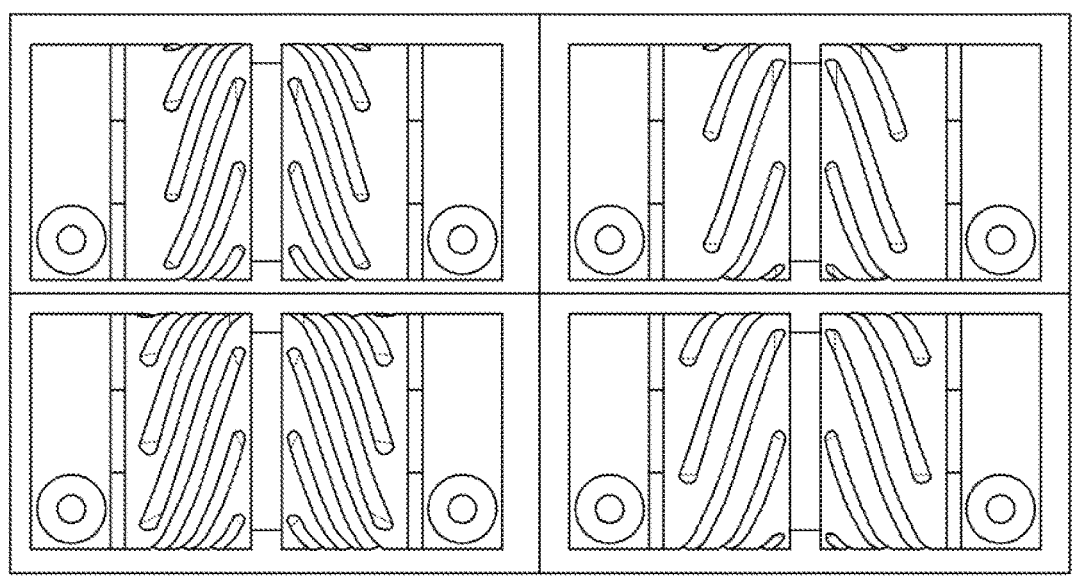
FIG. 8B shows different embodiments of the torque cell of FIG. 8A.

FIG. 8B shows that like the other load cells, the torque cell design is easily parameterized to adjust the trade-off between measurement range and stiffness. We can vary The number of cuts, the swept angle, and the helix angle can be varied. FIG. 8B shows several geometries varying number of cuts and swept angle while keeping the helix angle constant.

2 Axis (Force+Moment) Device

Figure 9A:
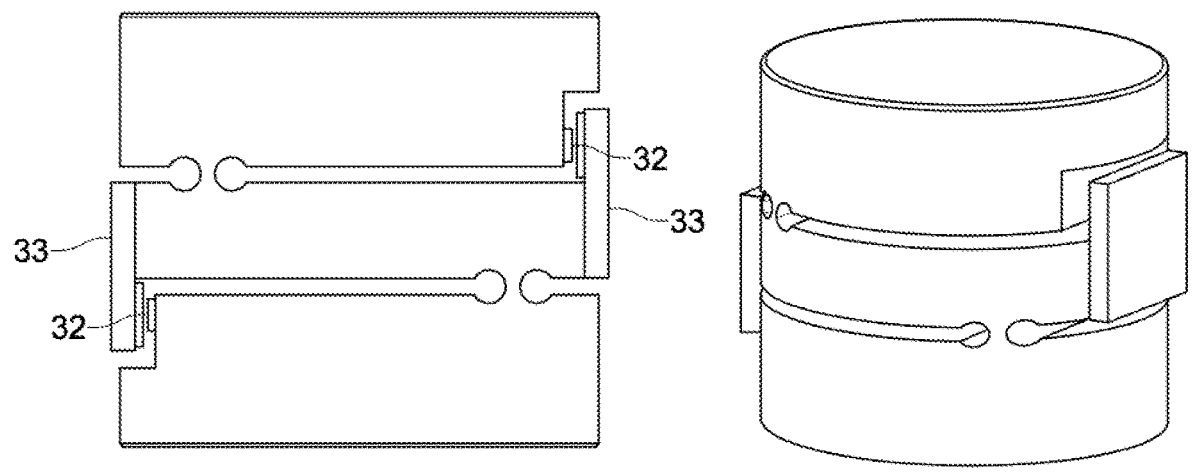
FIG. 9A shows a two axis load cell design that measures both force and moment.
Figure 9B:
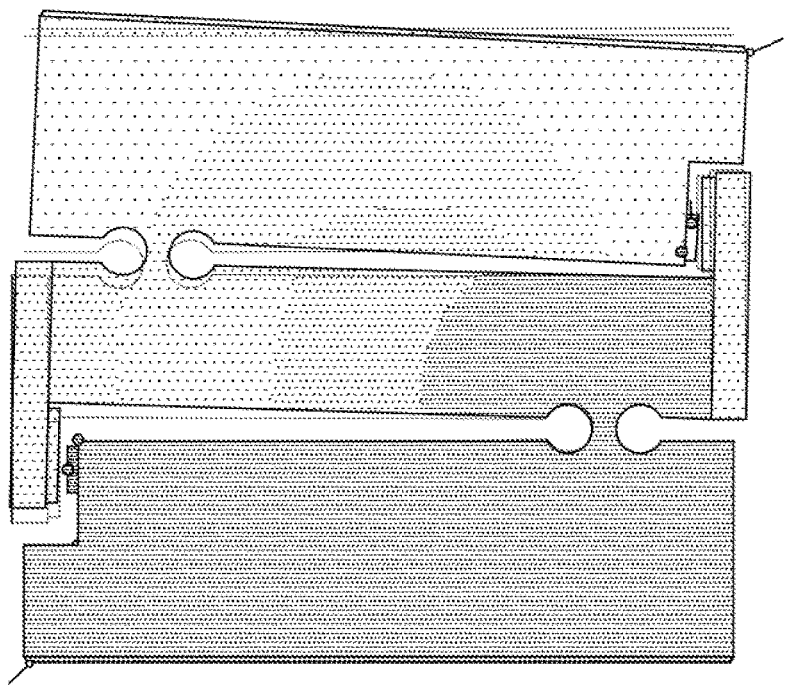
FIG. 9B shows the cell of FIG. 9A subject to force.
Figure 9C:
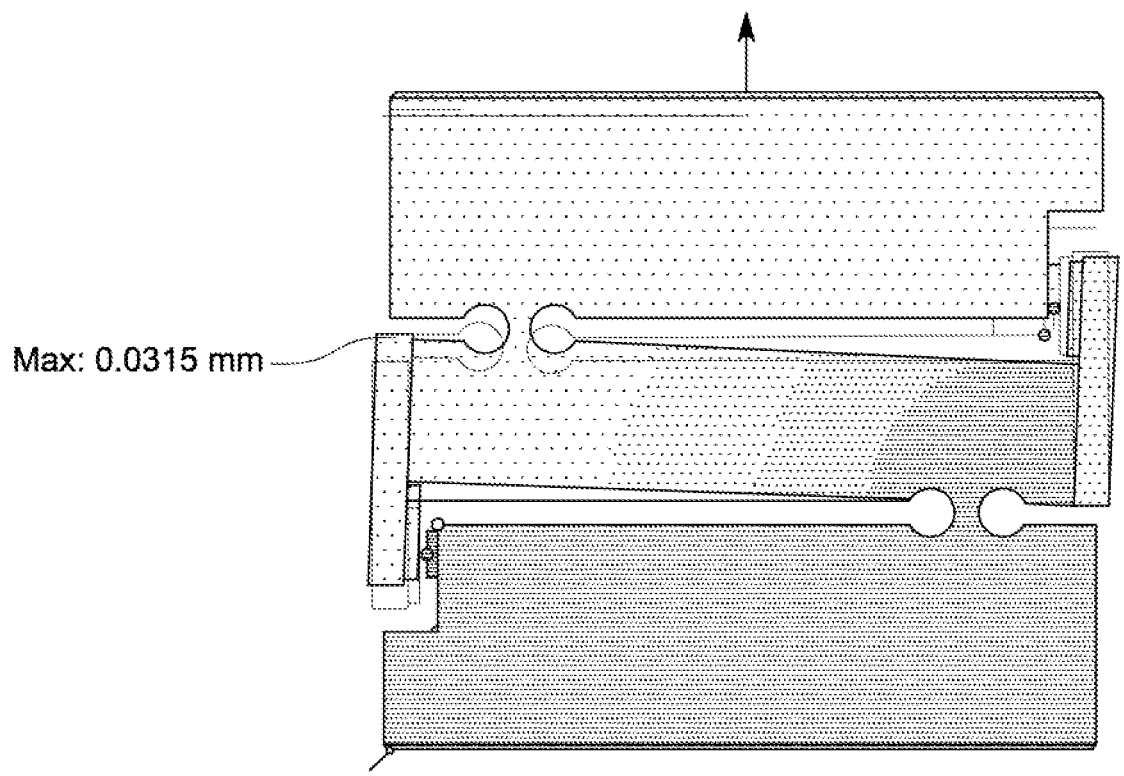
FIG. 9C shows the cell of FIG. 9A subject to a moment.

Many applications (such as prosthetics) require measurement of two degrees of freedom: a force and a moment about an axis perpendicular to the axis of force. FIG. 9A shows a design using a pair of non-contact magnetic sensors (33) and a relatively simple flexure (30). When subjected to a force, the magnets (32) also mounted to the flexure shift in the same direction relative to the sensors as shown in FIG. 9B. When subjected to a moment, the magnets shift in opposite directions relative to the sensors as shown in FIG. 9C.

Several descriptions and illustrations have been presented to aid in understanding the present invention. One with skill in the art will realize that numerous changes and variations may be made without departing from the spirit of the invention. These changes and variations are within the scope of the present invention.

We claim:

1. A non-contact magnetic load cell device for measuring force of torque comprising:
    an array of magnetic field sensors attached to a single silicon die which is itself attached to a first portion of a frame, signals from members of the array being combined differentially and processed to report differences in magnetic field strength in a particular direction and not report differences in magnetic field strength in other directions;
    one or more pairs of concentric opposing magnets attached to a second portion of the frame, the magnets separated from the array of field sensors by a small gap;
    wherein, the second portion of the frame is free to displace in relation to the first portion of the frame;
    whereby, displacement of the second portion of the frame in relation to the first portion of the frame in the particular direction results in a measurable differential change in magnetic field reported by the array of magnetic field sensors that can be sampled and processed to relate to a force or torque applied between the first portion of the frame and the second portion of the frame and whereby displacement of the second portion of the frame in relation to the first portion of the frame in a direction other than the particular direction results in negligible differential change in the magnetic field.

2. The non-contact magnetic load cell device of claim 1 wherein the plurality of magnets are permanent magnets.

3. The non-contact magnetic load cell device of claim 1 wherein the array of magnetic field sensors comprises Hall-effect sensors.

4. The non-contact magnetic load cell device of claim 1 comprising one pair of concentric magnets.

5. The non-contact magnetic load cell device of claim 1 wherein signals from the sensors in the sensor array are bussed, and further comprising temperature sensor chips on buses.

6. The non-contact magnetic load cell device of claim 5 wherein signals from the bussed digital interfaces are communicated wirelessly to a remote processor.

7. The non-contact magnetic load cell device of claim 6 wherein the remote processor processes said signals differentially and converts the signals to indications of force or torque applied to the device.

8. The non-contact magnetic load cell device of claim 1 as a six degree of freedom load cell, further comprising a pair of flexural plates supporting a carrier with four concentric pairs of magnets attached to the carrier; and further comprising a four magnetic sensor arrays, each separated from one of the four concentric pairs of magnets by a small gap; whereby, when a force or torque is applied to flexural plates, the concentric pairs of magnets experience a displacement resulting in differential signals from the sensor arrays that can be remotely processed to indicate a force or torque value.

9. The non-contact magnetic load cell device of claim 8 wherein the differential signals from the sensor arrays are bussed to a processor adapted to estimate the force or torque value.

10. The non-contact magnetic load cell device of claim 8 wherein the differential signals from the sensor arrays are communicated wirelessly to a remote processor adapted to estimate the force or torque value.

11. The non-contact magnetic load cell device of claim 1 as a load cell, further comprising a pair of flexural plates supporting a carrier with at least one concentric pair of magnets attached to the carrier; and further comprising at least one magnetic sensor array separated from the concentric pair of magnets by a small gap; whereby, when a force or torque is applied to flexural plates, the concentric pairs of magnets experience a displacement resulting in differential signals from the sensor array that can be remotely processed to indicate a force or torque value.

12. The non-contact magnetic load cell device of claim 1 as a single axis torque cell wherein the second portion of the frame is flexure that translates in an axial direction when subject to a torque; the plurality of magnets is an opposing pair of ring magnets mounted on the flexure, and the array of magnetic field sensors is a pair of differential Hall-effect sensors mounted on the first portion of the frame.

13. The non-contact magnetic load cell device of claim 1 as a two degree of freedom force and torque sensor wherein the second portion of the frame is a flexure with a pair of magnets attached constructed so that an applied force shifts both magnets in the same direction relative to the array of magnetic field sensors, and an applied torque shifts the magnets in opposite directions relative to the array of magnetic field sensors.

14. A non-contact magnetic load cell adapted to measure force or torque comprising:
    a plurality of magnetic field sensors;
    a plurality of magnets;
    wherein, the magnets are located in proximity to the field sensors, and wherein the load cell is constructed so that the magnets move in relation to the magnetic field sensors when a force or torque is applied;
    wherein, the plurality of magnets are arranged in pairs polarized in opposition to one-another, and the magnetic field sensors are positioned in an array;
    wherein the plurality of magnetic field sensors in the array are connected to supply differential signals; and
    wherein the load cell measures force when the magnets move in a same direction relative to the sensors and measure torque when the magnets move in opposite directions relative to the sensors.

15. The non-contact magnetic load cell of claim 14 wherein the magnets are permanent magnets.

16. The non-contact magnetic load cell of claim 14 wherein the magnetic sensors are Hall-effect sensors.

17. A method of measuring force or torque comprising:
- arranging pairs of magnets in together polarized in opposition to one-another;
- arranging a plurality of magnetic field sensors in a tight array;
- attaching the magnetic field sensors to a first portion of a frame;
- attaching the pairs of magnets to a second portion of the frame, wherein, the second portion of the frame is free to move in relation to the first portion of the frame under an applied force or torque;
- reading difference signals from the magnetic field sensors when the second portion of the frame moves in relation to the first portion of the frame to determine the applied force or torque;
- measuring force when the magnets move in a same direction relative to the sensors and measuring torque when the magnets move in opposite directions relative to the sensors.

18. The method of claim 17 wherein the magnets are permanent magnets.

19. The method of claim 17 wherein the magnetic field sensors are Hall-effect sensors.

20. The method of claim 17 further comprising transmitting the difference signals to a remote processor.

* * * * *